US011412640B2

(12) United States Patent
Tomescu

(10) Patent No.: US 11,412,640 B2
(45) Date of Patent: Aug. 9, 2022

(54) PLATE COOLER FOR AIRCRAFT ELECTRONIC COMPONENTS

(71) Applicant: PRATT & WHITNEY CANADA CORP., Longueuil (CA)

(72) Inventor: Dana Tomescu, Brampton (CA)

(73) Assignee: PRATT & WHITNEY CANADA CORP., Longueuil (CA)

( * ) Notice: Subject to any disclaimer, the term of this patent is extended or adjusted under 35 U.S.C. 154(b) by 297 days.

(21) Appl. No.: 16/539,226

(22) Filed: Aug. 13, 2019

(65) Prior Publication Data

US 2021/0037681 A1  Feb. 4, 2021

Related U.S. Application Data

(60) Provisional application No. 62/879,689, filed on Jul. 29, 2019.

(51) Int. Cl.
  *H05K 7/20* (2006.01)
  *B64D 13/00* (2006.01)
  *B64D 13/06* (2006.01)

(52) U.S. Cl.
  CPC ....... *H05K 7/20872* (2013.01); *B64D 13/006* (2013.01); *H05K 7/20272* (2013.01); *B64D 2013/0614* (2013.01); *H05K 7/20254* (2013.01)

(58) Field of Classification Search
  CPC .................. H05K 7/20254; B64D 2013/0614
  See application file for complete search history.

(56) References Cited

U.S. PATENT DOCUMENTS

| 4,576,222 | A  | * | 3/1986  | Granata, Jr. .......... F22B 37/228 |
|           |    |   |         |                              165/76 |
| 7,321,494 | B2 |   | 1/2008  | Han |
| 7,339,792 | B2 |   | 3/2008  | Han |
| 8,408,282 | B2 |   | 4/2013  | Brand et al. |
| 9,502,329 | B2 |   | 11/2016 | Nagaune |
| 9,596,785 | B2 | * | 3/2017  | Brand ................ H05K 7/20254 |
| 9,953,899 | B2 |   | 4/2018  | Chen et al. |
| 9,980,415 | B2 |   | 5/2018  | Zhou |
| 10,156,404 | B2 |  | 12/2018 | Ueda |
| 10,224,263 | B2 |  | 3/2019  | Provenziani |
| 2004/0226704 | A1 | | 11/2004 | Sella |
| 2011/0272120 | A1 | * | 11/2011 | Joshi ................... F28D 1/05366 |
|           |    |   |         |                              165/104.13 |
| 2017/0231115 | A1 | * | 8/2017  | Kobayashi ......... H05K 7/20218 |
| 2018/0139865 | A1 | * | 5/2018  | Draht ................ H05K 7/20254 |

* cited by examiner

*Primary Examiner* — Lionel Nouketcha
(74) *Attorney, Agent, or Firm* — Norton Rose Fulbright Canada LLP

(57) ABSTRACT

A heat exchanger for aircraft electronic components includes a first plate having channels arranged with side-by-side channel inlets fed from a common fluid supply manifold extending to the channel inlets from a manifold inlet. The channel inlets include a first set of inlets spaced further away from the manifold inlet than a second set of inlets. The fluid supply manifold has a flow divider positioned fluidly between the manifold inlet and the channel inlets. The flow divider is configured in use to direct heat exchange fluid entering the manifold from the manifold inlet preferentially toward the first set of inlets. A second plate is coupled with the first plate to seal the channels and the fluid supply manifold.

19 Claims, 5 Drawing Sheets

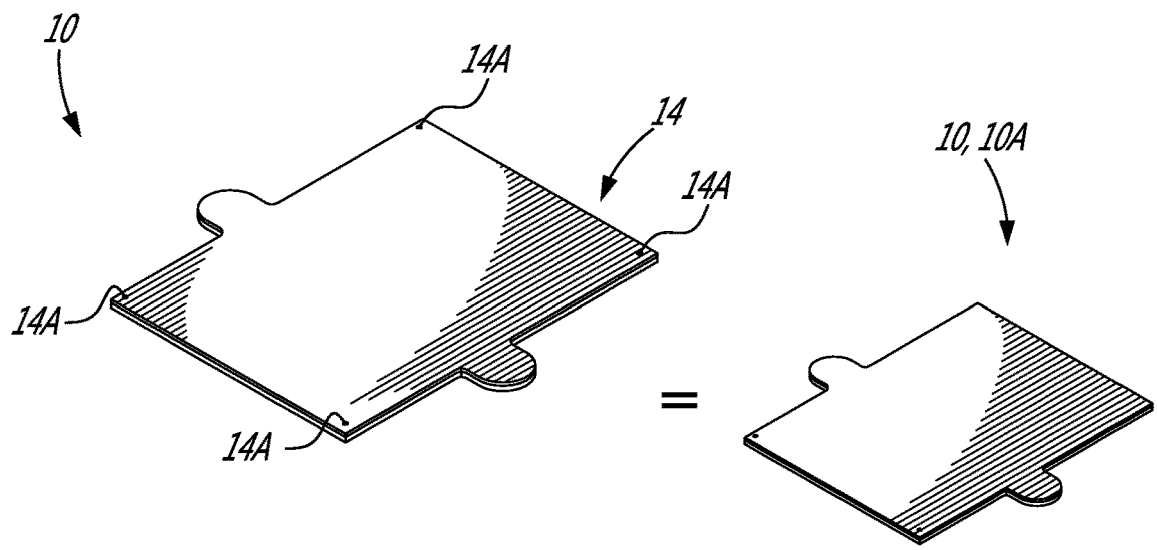
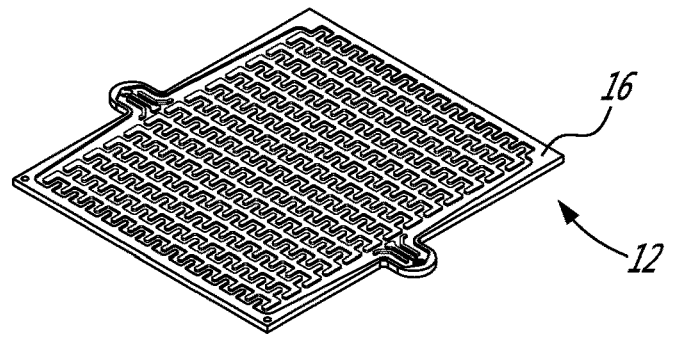
FIG_1A
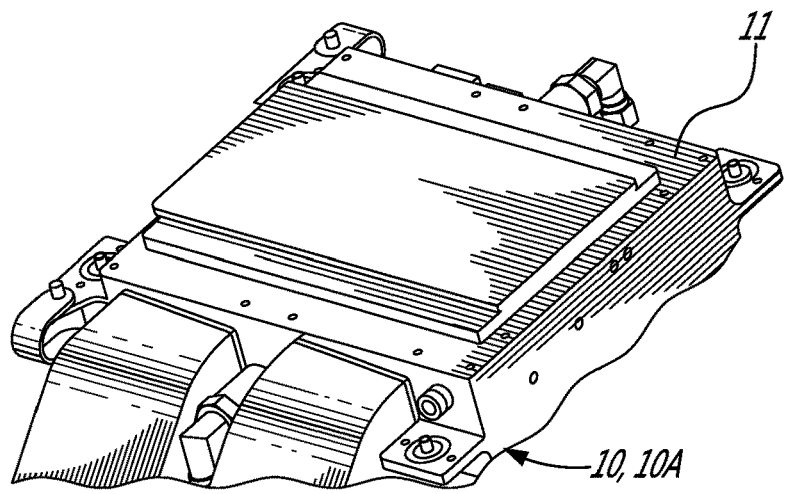
FIG_1B

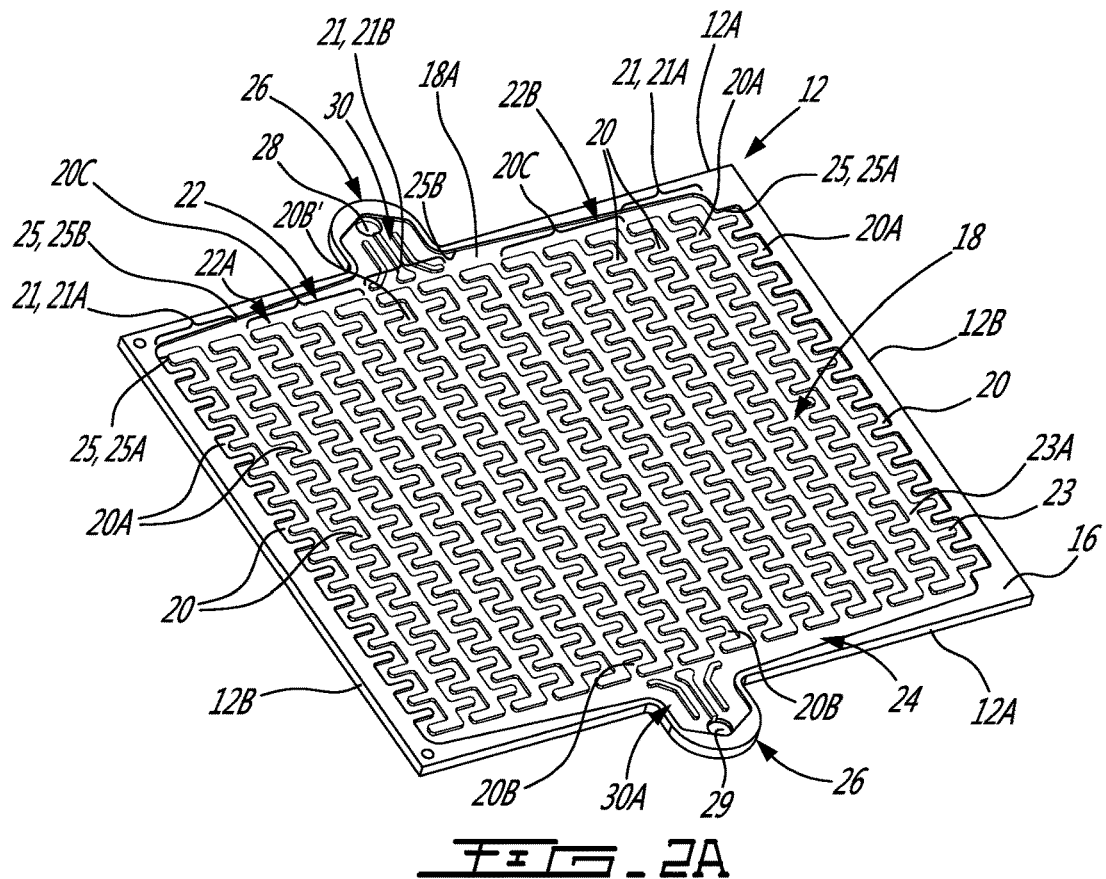
FIG_2A
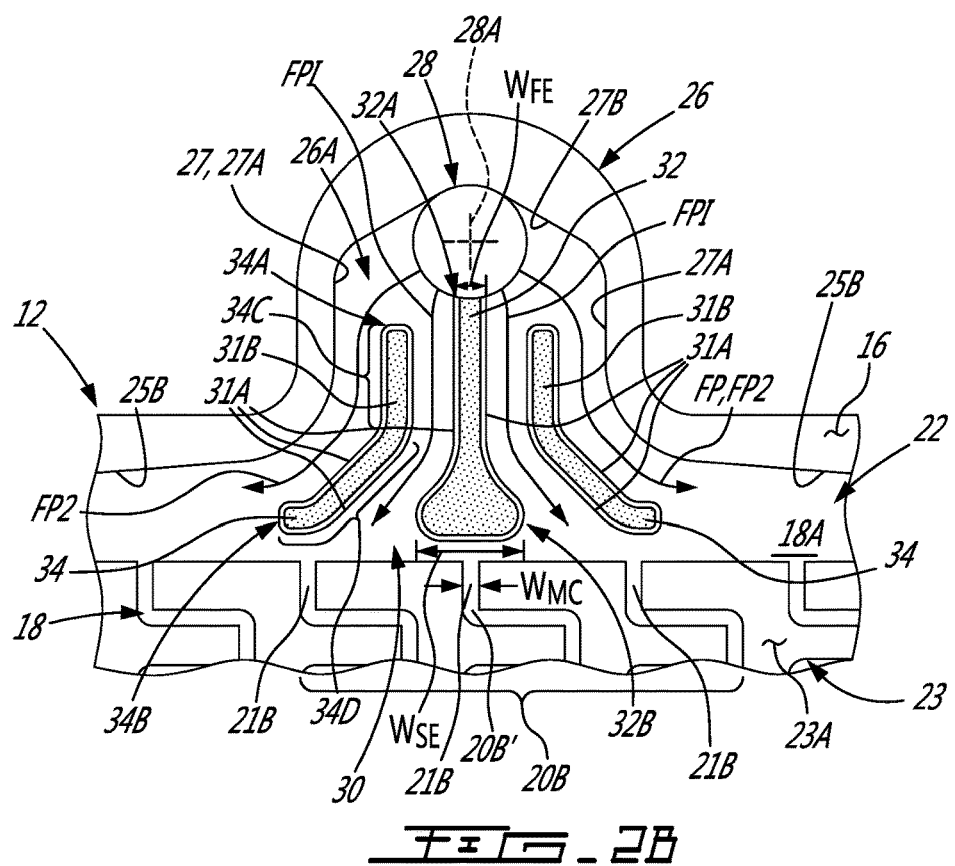
FIG_2B

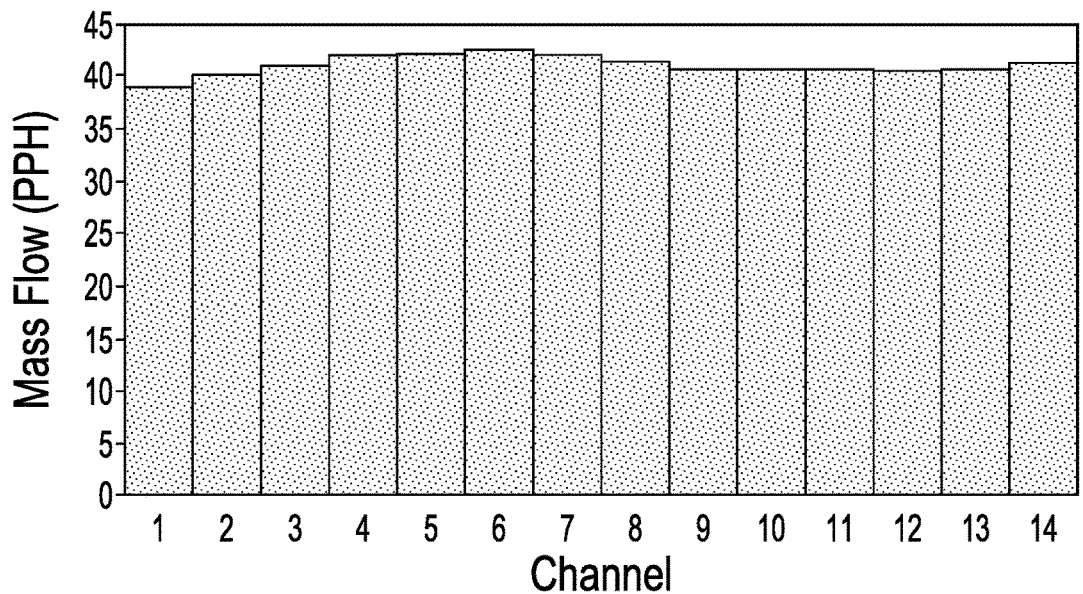
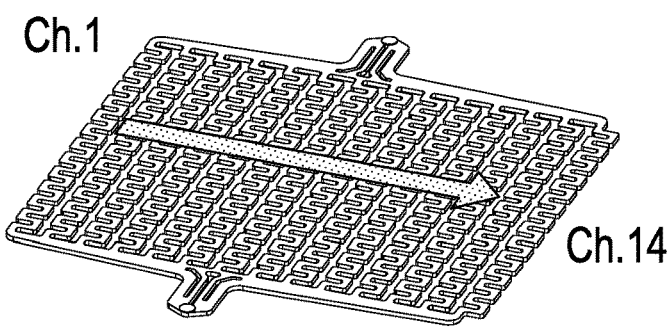
FIG. 3
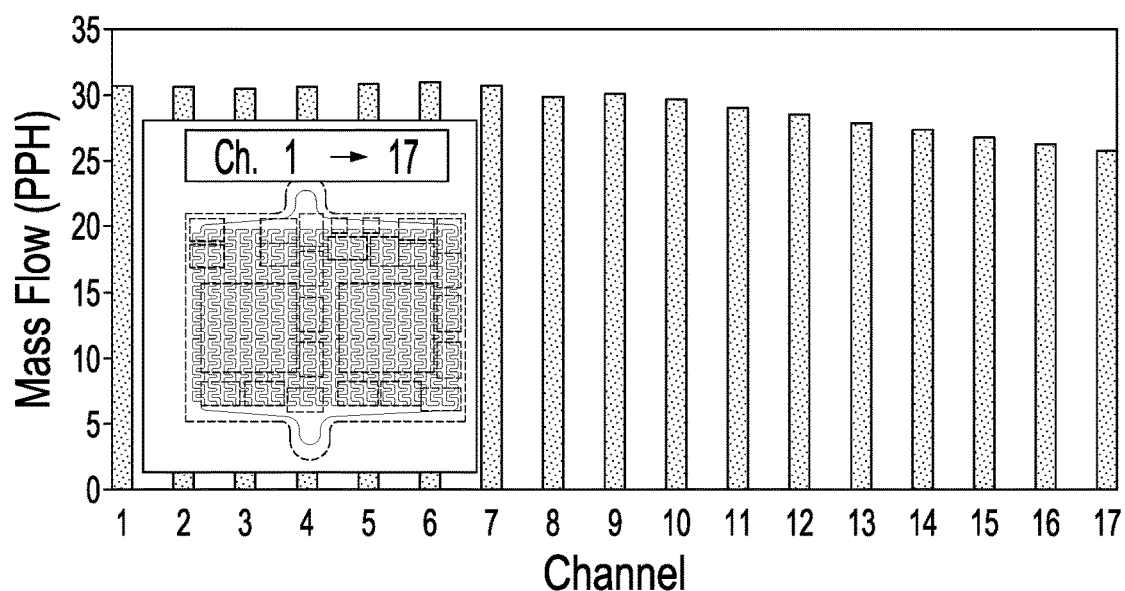
FIG. 4

PLATE COOLER FOR AIRCRAFT ELECTRONIC COMPONENTS

CROSS-REFERENCE TO RELATED APPLICATIONS

This application claims priority to U.S. provisional patent application No. 62/879,689 filed Jul. 29, 2019, the entire content of which is incorporated by reference herein.

TECHNICAL FIELD

The application relates generally to heat exchangers in aircraft and, more particularly, to heat exchangers for aircraft electronic components.

BACKGROUND

Electronic components used in aircraft often create heat and as such are generally cooled. Although a variety of cooling options are available, in airborne applications the choices are typically limited by weight, cost, reliability, and so on. Furthermore, since devices requiring cooling may experience differential heating across their bodies, cooling systems must often be over-sized, or include complicated valving etc., to ensure all areas are adequately cooled.

SUMMARY

There is provided a plate cooler for aircraft electronic components, the plate cooler comprising: cooling channels arranged with side-by-side cooling channel inlets fed from a common fluid supply manifold extending to the cooling channel inlets from a manifold inlet, the cooling channel inlets including a first set of inlets spaced further away from the manifold inlet than a second set of inlets, the fluid supply manifold having a flow divider positioned fluidly between the manifold inlet and the cooling channels inlets, the flow divider configured in use to direct coolant entering the manifold from the manifold inlet preferentially toward the first set of inlets.

There is provided a method of distributing coolant through a plate cooler for aircraft electronic components, the method comprising: directing the coolant toward cooling channels in the plate cooler arranged with side-by-side cooling channel inlets; and dividing the coolant, upstream of the cooling channels, to direct the coolant toward the cooling channels inlets along a periphery of the plate cooler.

There is provided a heat exchanger for aircraft electronic components, comprising: a first plate having channels arranged with side-by-side channel inlets fed from a common fluid supply manifold extending to the channel inlets from a manifold inlet, the channel inlets including a first set of inlets spaced further away from the manifold inlet than a second set of inlets, the fluid supply manifold having a flow divider positioned fluidly between the manifold inlet and the channel inlets, the flow divider configured in use to direct heat exchange fluid entering the manifold from the manifold inlet preferentially toward the first set of inlets; and a second plate coupled with the first plate to seal the channels and the fluid supply manifold.

DESCRIPTION OF THE DRAWINGS

Reference is now made to the accompanying figures in which:

FIG. 1A shows an exploded and assembled view of a heat exchanger including first and second plates;

FIG. 1B shows the heat exchanger of FIG. 1A mounted to an aircraft electronic component;

FIG. 2A is a perspective view of the first plate of the heat exchanger of FIG. 1A;

FIG. 2B is an enlarged view of a flow divider of the first plate shown in FIG. 2A;

FIG. 3 is a graph plotting coolant mass flow in each cooling channel of the first plate with the flow divider;

FIG. 4 is a graph plotting coolant mass flow in each channel of a heat exchanger without a flow divider;

DETAILED DESCRIPTION

Figure 5:
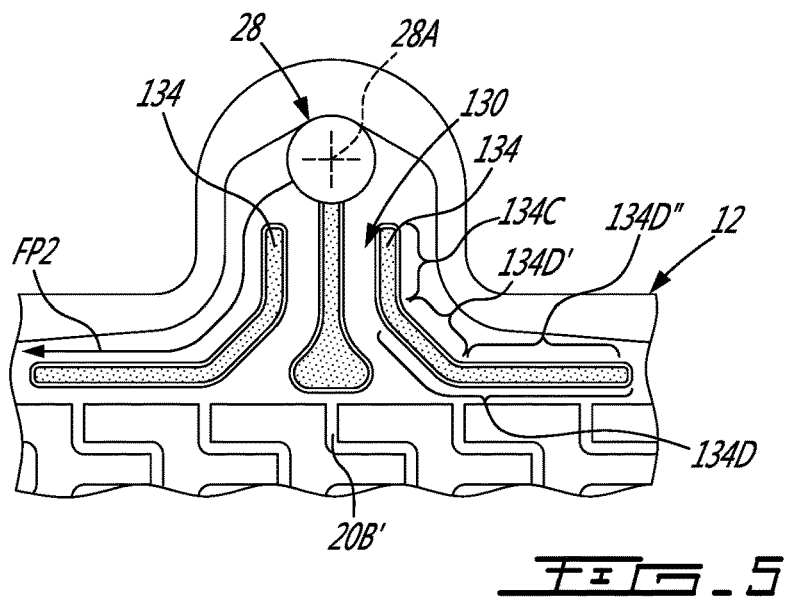
FIG. 5 is an enlarged view of another configuration of the flow divider of the first plate shown in FIG. 2A.

Referring to FIG. 1A, a plate cooler 10 for a heated surface is shown in an exploded view and an assembled view. The plate cooler 10 is used in the depicted embodiment to remove heat from electronic components in aircraft, such as power electronic equipment. The heat is transferred to a coolant passing through the plate cooler 10.

One possible example of an aircraft electronic component that may be cooled by the plate cooler 10 is a power control unit (PCU) 11 of a gas turbine engine of the aircraft, which is shown in FIG. 1B. The PCU 11 may be part of a hybrid electric propulsion system for an aircraft. The plate cooler 10 is mounted to one side of the PCU 11, which in FIG. 1B is the underside of the PCU 11, to receive heat from the PCU 11 and to direct heated coolant away from the PCU 11. In FIG. 1B, the plate cooler 10 has a substantially horizontal orientation, such that the PCU 11 sits on top of the plate cooler 10. Other aircraft electronic components may be used with the plate cooler 10. Although the plate cooler 10 is described herein as being used to remove heat from a device or component, it will be appreciated that the plate cooler 10 may also be used with minimal adaptation to transfer heat to a device or component. Thus, the use of the words "cooler", "cooling", or "coolant" herein do not limit the plate cooler 10 to being used only to remove heat. In this regard, the plate cooler 10 is a heat exchanger 10A, which may employ any suitable heat-exchange fluid to exchange heat energy with a device or component. Non-limiting examples of suitable coolant or heat-exchange fluids include aircraft fuel, oil, refrigerant, and hydraulic fluids.

Referring to FIG. 1A, the plate cooler 10 has a first plate or body 12 through which the coolant flows. The plate cooler 10 also includes a second plate 14 on top of which electronic components, such as the PCU 11, may be mounted. The second plate 14 may include mounting holes 14A on an outer surface thereof for mounting the electronic component to the second plate 14. The second plate 14 may thus be considered an electronic component mounting plate. The body 12 and the second plate 14 are coupled together to form the plate cooler 10. In FIG. 1A, the second plate 14 is mounted to an outer surface 16 of the body 12, such that it is in heat exchange relationship with the body 12. By "heat exchange relationship", it is understood that the second plate 14 is mounted to the body 12 so that heat energy can be transferred from the electronic component, to the second plate 14, and ultimately to the body 12. When mounted to the body 12, the second plate 14 seals the volume defined between the body 12 and the second plate 14, such that any coolant which enters the volume is confined thereto. The body and second plate 12,14 may be made of aluminum, but may alternatively be made from other types of heat conducting material, for example copper, etc.

Referring to FIG. 2A, the body 12 has a recessed area 18. The recessed area 18 is a portion of the body 12 that is recessed, or spaced inwardly into the body 12, from the outer surface 16 to which the second plate 14 is mounted. The recessed area 18 includes a bottom or floor 18A of the body 12, which is spaced inwardly into the body 12 from the outer surface 16. Coolant flows through the body 12 by flowing along the floor 18A. As described in greater detail below, multiple fluid paths for the coolant are defined along and through the recessed area 18.

The recessed area 18 of the body 12 includes multiple cooling channels 20 located in a side-by-side, parallel arrangement, a fluid supply manifold 22 in fluid flow communication with inlets 21 of the cooling channels 20 for supplying coolant thereto, and a fluid exit manifold 24 in fluid flow communication with a second opposed end of the cooling channels 20 having outlets for discharging coolant therefrom. The fluid supply and exit manifolds 22,24 face each other from opposed sides of the cooling channels 20 and are transversely disposed with respect thereto. In FIG. 2A, the body 12 has a generally rectangular contour with two protrusions 26 extending outwardly from the longitudinal side walls 12A of the body 12. The protrusions 26 are located on opposite longitudinal side walls 12A of the body 12 and are located in the same horizontal plane as the body 12. The protrusions 26 are laterally aligned on the opposite sides of the body 12. The protrusions 26 are positioned along the same line being parallel to the lateral side walls 12B of the body 12. In FIG. 2A, the protrusions 26 are positioned closer to one of the lateral side walls 12B of the body 12 than to the other lateral side wall 12B. The plate cooler 10 shown in FIG. 2A is thus "asymmetric". In an alternate embodiment, the protrusions 26 are spaced equidistantly between the lateral side walls 12B of the body 12. In such an embodiment, the plate cooler 10 is "symmetric". One of the protrusions 26 includes a manifold or fluid inlet 28, while the other protrusion 26 includes a manifold or fluid outlet 29. The fluid inlet 28 in FIG. 2A is an opening extending through the body 12, and is in fluid flow communication with the fluid supply manifold 22 for supplying coolant thereto. The fluid outlet 29 in FIG. 2A is an opening extending through the body 12, and is in fluid flow communication with the fluid exit manifold 24 for discharging the coolant from the body 12. The body 12 may include a safety channel defined in the body 12 and circumscribing the cooling channels 20, the fluid supply and fluid exit manifolds 22,24, and the fluid inlet and fluid outlets 28,29.

Still referring to FIG. 2A, the cooling channels 20 are provided for having coolant flow therethrough from their inlets 21. The inlets 21 are arranged side-by-side, and spaced apart from each other in a direction parallel to the longitudinal side walls 12A of the body 12. The cooling channels 20 may have a zigzag type configuration with rectangular cross sections, which in the embodiment shown, are all identical. In another embodiment, the cooling channels 20 may have different configurations with respect to one another. In FIG. 2A, the cooling channels 20 define a tortuous or serpentine flow path between the first and second ends, and between the fluid supply and exit manifolds 22,24. The cooling channels 20 geometry may be as described in U.S. Pat. No. 8,408,282 B2 to assignee Pratt & Whitney Canada Corp., the entire contents of which are incorporated by reference herein.

Referring to FIG. 2A, the cooling channels 20 are defined between channel separators 23 which protrude from the floor 18A of the recessed area 18. The channel separators 23 are any bodies which have side walls transverse to the floor 18A so that the flow of coolant is confined to the cooling channel 20 defined by adjacent channel separators 23. The channel separators 23 thus define multiple fluid paths for the coolant through the recessed area 18. In FIG. 2A, the outer surface 23A of the channel separators 23 is at the same height from the floor 18A as the outer surface 16 of the body 12. In FIG. 2A, the outer surface 23A of the channel separators 23 is in the same horizontal plane as the outer surface 16 of the body 12. In FIG. 2A, the outer surface 23A of the channel separators 23 is level with the outer surface 16 of the body 12. Thus, when the second plate 14 is mounted to the body 12, a surface of the second plate 14 engages the outer surface 23A of the channel separators 23. This forms a seal with the outer surface 23A and with the outer surface 16 of the body 12. The coolant is therefore confined to flowing in the fluid supply and exit manifolds 22,24, and in the cooling channels 20. In an alternate embodiment, the outer surface 23A of the channel separators 23 is closer to the floor 18A than the outer surface 16 of the body 12, but still high enough to guide coolant through the cooling channels 20.

Still referring to FIG. 2A, the cooling channels 20 including peripheral cooling channels 20A and one or more central cooling channels 20B. The peripheral cooling channels 20A are located along the periphery of the body 12. In FIG. 2A, the peripheral cooling channels 20A include one or more of the cooling channels 20 that are nearest to each of the lateral side walls 12B of the body 12. The number of peripheral cooling channels 20A includes at least two (i.e. the peripheral cooling channel 20A immediately adjacent to each of the lateral side walls 12B of the body 12), and may include more.

The central cooling channels 20B are positioned between the peripheral cooling channels 20A. In FIGS. 2A and 2B, the central cooling channels 20B are aligned with the protrusions 26, such that the central cooling channels 20B are closer to one of the lateral side walls 12B of the body 12 than to the other lateral side wall 12B. The plate cooler 10 shown in FIG. 2A thus has an "asymmetric" arrangement of the cooling channels 20. In an alternate embodiment, the central cooling channels 20B are spaced equidistantly from both lateral side walls 12B of the body 12. In such an embodiment, the plate cooler 10 has a "symmetric" arrangement of the cooling channels 20. The number of central cooling channels 20B may vary as a function of the distribution of coolant through the cooling channels 20, and the total number of cooling channels 20, to name just some factors. The central cooling channels 20B include a middle cooling channel 20B'. The middle cooling channel 20B' is one of the central cooling channels 20B that corresponds to a middlemost one of the central cooling channels 20B. For example, in the rectangular configuration of the body 12 shown in FIG. 2A, the middlemost one of the central cooling channels 20B (i.e. the middle cooling channel 20B') is the central cooling channel 20B that is furthest from both the lateral side walls 12B of the body 12. The central cooling channels 20B therefore include the middle cooling channel 20B', and may also include one or more of the cooling channels 20 on either side of the middle cooling channel 20B'. Depending on the total number of cooling channels 20 in the body 12, there may also be intermediate cooling channels 20C positioned between the central cooling channels 20B and the peripheral cooling channels 20A. The configuration of cooling channels 20 shown in FIG. 2A includes intermediate cooling channels 20C.

The inlets 21 of the cooling channels 20 correspond to the distribution of peripheral, central, and intermediate cooling channels 20A,20B,20C. The inlets 21 are each fed from the common fluid supply manifold 24 and its fluid inlet 28. The inlets 21 of the cooling channels 20 include a first set of inlets 21A which are spaced further away from the fluid inlet 28 than a second set of inlets 21B. The direction of spacing of the first and second set of inlets 21A,21B is transverse to the length of the cooling channels 20. For example, in FIG. 2A, the first set of inlets 21A corresponds to those of the peripheral cooling channels 20A, and may also include those of the intermediate cooling channels 20C which are closer to the lateral side walls 12B of the body 21. In FIG. 2A, the second set of inlets 21B corresponds to those of the central cooling channels 20B, and may also include those of the intermediate cooling channels 20C which are closer to the central cooling channels 20B. Other arrangements of the first and second set of inlets 21A,21B are possible. For example, in another embodiment, the fluid inlet 28 is disposed closest to the peripheral cooling channels 20A, such that the first set of inlets 21A corresponds to those of central cooling channels 20B and the second set of inlets 21B corresponds to those of the peripheral cooling channels 20A.

Referring to FIG. 2A, the fluid supply manifold 22 is part of the recessed area 18 of the body 12. The fluid supply manifold 22 is defined by the floor 18A of the recessed area 18, and inner walls 25 of the body 12 which delimit part of the recessed area 18. The inner walls 25 are perpendicular to the floor 18B in FIG. 2A and project away therefrom. The inner walls 25 delimiting and defining the fluid supply manifold 22 include first inner walls 25A which are located adjacent to the cooling channels 20 for directing the coolant toward the cooling channels 20, and second inner walls 25B intersecting the first inner walls 25A and being transverse thereto. The first and second inner walls 25A,25B thus delimit and define first and second portions 22A,22B of the fluid supply manifold 22 that extending laterally from opposed sides of the fluid inlet 28 and transverse to the cooling channels 20. The second inner walls 25B extend outwardly from the protrusions 26 and toward the cooling channels 20 such that the fluid supply manifold 22 decreases in spacing or narrow toward the lateral side walls 12B of the body 12. Coolant which enters the fluid inlet 28 and into the fluid supply manifold 22 is thus directed by the first and second inner walls 25A,25B toward the first set of inlets 21A of the cooling channels 20. The structure and layout of the fluid exit manifold 24 is similar to that of the fluid supply manifold 22, and thus the description of the fluid supply manifold 22 herein applies mutatis mutandis to the fluid exit manifold 24.

Referring to FIG. 2B, the recessed area 18 of the body 12 includes and extends to the protrusions 26. A recessed protrusion area 26A is part of the recessed area 18. The recessed protrusion area 26A is delimited and defined by the floor 18A of the recessed area 18, and inner protrusion walls 27 of the protrusions 26. The inner protrusions walls 27 are perpendicular to the floor 18B in FIG. 2B, and project away therefrom. The inner protrusion walls 27 delimiting and defining the recessed protrusions area 26A include lateral inner walls 27A which are located adjacent to and intersect the second inner walls 25B, and an inlet inner wall 27B intersecting the lateral inner walls 27A and being transverse thereto. The inlet inner wall 27B is adjacent to the fluid inlet 28. In FIG. 2B, the inlet inner wall 27B intersects the edge of the opening in the body 12 defining the fluid inlet 28. The lateral and inlet inner walls 27A,27B may be curved, angled, or straight, as desired. Coolant which enters the fluid inlet 28 and into the recessed protrusion area 26A is thus directed by the lateral and inlet inner walls 27A,27B toward the fluid supply manifold 22. In FIGS. 2A and 2B, the depth of the recessed area 18 (i.e. the distance of the floor 18A from the outer surface 16 of the body 12) is the same in the recessed protrusion area 26A, the fluid supply and exit manifolds 22,24, and the cooling channels 20.

Other details of the body 12 and the heat exchanger 10A may be described in U.S. Pat. No. 9,596,785 B2 to assignee Pratt & Whitney Canada Corp., the entire contents of which are incorporated by reference herein.

Referring to FIG. 2B, the plate cooler 10 includes one or more flow dividers 30. The flow divider 30 is positioned in the fluid supply manifold 22 between the fluid inlet 28 and the cooling channels 20, and helps to partition or separate the flow of coolant from the fluid inlet 28 so that it is more evenly distributed among all the cooling channels 20. Irrespective of the different configurations it may take, the flow divider 30 is a protruding body extending from the floor 18A of the recessed area 18 and has walls 31A that are transverse to the floor 18A so as to obstruct the flow of coolant through the area of the floor 18A occupied by the flow divider 30. The flow of coolant obstructed in this manner flows along the floor 18A and along the walls 31A of the flow divider 30, to bypass the flow divider 30 along its walls 31A. An outer wall 31B of the flow divider 30 is level with the outer surface 16 of the body 12 in FIG. 2B. In an alternate embodiment, the outer wall 31B of the floor divider 30 is closer to the floor 18A than the outer surface 16 of the body 12, but still high enough so that the walls 31A of the flow divider 30 can separate or divert coolant. The flow divider 30 may be integral with the body 12 of the plate cooler 10, or separate from the body 12 and mounted thereto.

In its position in the fluid supply manifold 22 between the fluid inlet 28 and the cooling channels 20, the flow divider 30 obstructs partially or completely the inlets 21 of one or more of the cooling channels 20. By "obstructs", it is understood that the flow divider 30 blocks or restricts the inlet 21 of one or more of the cooling channels 20 such that the flow of coolant from the fluid inlet 28 is reduced when entering the obstructed one or more inlet 21 compared to if there were no flow divider 30 obstructing the one or more inlet 21, or is prevented entirely from entering the obstructed one or more inlet 21. The coolant obstructed in this manner by the flow divider 30 is directed along the floor 18A and the walls 31A toward other cooling channels 20, and preferentially, toward the peripheral cooling channels 20A. Some of the coolant obstructed in this manner is thus directed along the floor 18A, along the first and second portions 22A,22B of the fluid supply manifold 22, and along the walls 31A to bypass the flow divider 30, to enter the first set of inlets 21A of the peripheral cooling channels 20A. In FIGS. 2A and 2B, the flow divider 30 obstructs only the central cooling channels 20B. The intermediate and peripheral cooling channels 20C,20A remain unobstructed or free of obstruction by the flow divider 30.

For some electrical components of aircraft, such as the PCU 11, there may be a need for more cooling along the periphery of the body 12 or first plate because of the distribution of heat generated from the use of the PCU 11. The PCU 11 may generate a high heat load which varies with the operating conditions of the gas turbine engine, and the highest heat load can be generated at the periphery of the PCU 11. Furthermore, the peripheral cooling channels 20A may sometimes receive less coolant than the other cooling channels 20 because the coolant has to travel the furthest distance from the fluid inlet 28 to the peripheral cooling channels 20 and because losses build up along the way, thereby reducing the cooling capacity of the plate cooler 10 along the peripheral cooling channels 20A. The flow divider 30, in restricting the access of the coolant to one or more of the inlets 21 of the cooling channels 20, helps to divert the coolant toward the first set of inlets 21A of the outer, peripheral cooling channels 20A. This helps to increase the cooling capacity of the plate cooler 10 at its periphery. Thus the presence of the flow divider 30 at the fluid inlet 28 of the plate cooler 10 may help to direct coolant toward the cooling channels 20 that are farthest away from the fluid inlet 28.

FIGS. 3 and 4 show the possible effect of the flow divider 30 on the distribution of coolant to the cooling channels 20. FIG. 4 is a graph plotting coolant mass flow in each channel of the fluid of a heat exchanger without a flow divider. As can be seen, the mass flow of the fluid toward some of the outermost channels is lower than the mass flow of the fluid in the channels nearest the inlet. The difference between highest and lowest mass flow in the channels is 17%. As shown in FIG. 4, there may be a large difference in mass flow distribution among channels, with decreasing flow towards the outermost channels, in the heat exchanger without a flow divider. If less fluid makes it to the outermost channel, it may also be moving too slowly to be effective at cooling. FIG. 3 is a graph plotting coolant mass flow in each cooling channel 20 of the body 12 with the flow divider 30. As can be seen, the coolant mass flow in each cooling channel 20 is substantially the same. The flow divider 30 may thus help to improve mass flow distribution among the cooling channels 20. The flow divider 30 may thus improve the flow distribution among channels, particularly at the periphery of the cooling plate 10.

Different shapes, sizes, and positions of the flow divider 30 are possible and within the scope of the present disclosure in order to achieve such functionality, and examples of some of the possible shapes, sizes, and positions of the flow divider 30 are provided below. As will become apparent from these examples, the flow divider 30 allows the coolant to flow around it, and/or to flow through it.

Referring to FIG. 2A, the body 12 includes a second flow divider 30A positioned in the fluid exit manifold 24 between the fluid outlet 29 and the second end of the central cooling channels 20B. In this location, the second flow divider 30A may provide structural support for the mounting of the second plate 14 to the body 12.

Referring to FIG. 2B, the flow divider 30 obstructs, partially or completely, one of second set of inlets 21B the central cooling channels 20B. In FIG. 2B, the flow divider 30 obstructs, partially or completely, the inlet 21B of the middle cooling channel 20B'. In FIG. 2B, the flow divider 30 obstructs the inlet 21B of the middle cooling channel 20B' where the coolant from the fluid inlet 28 would flow toward but for the presence of the flow divider 30. By obstructing the middle cooling channel 20B', the flow divider 30 helps to divert coolant toward the other cooling channels 20, and in particular, toward the first set of inlets 21A of the peripheral cooling channels 20A. In another embodiment, the flow divider 30 obstructs more than one of the second set of inlets 21B of the central cooling channels 20B. The flow divider 30 has a length defined along a line parallel to the lateral side walls 12B of the body 12. The flow divider 30 extends in a direction parallel to a line between a center 28A of the fluid inlet 28 and the middle cooling channel 20B'. The flow divider 30 is thus aligned with the center 28A of the fluid inlet 28, such that the line along which the flow divider 30 extends intersects the middle cooling channel 20B' and the center 28A of the fluid inlet 28.

Still referring to FIG. 2B, some or all of the flow divider 30 is positioned in the recessed protrusion area 26A of the protrusion 26, along with the fluid inlet 28. The flow divider 30 in FIG. 2B includes a middle portion 32. The middle portion 32 is a protruding body extending from the floor 18A of the recessed area 18 and has walls 31A that are transverse to the floor 18A so as to obstruct the flow of coolant through the area of the floor 18A occupied by the middle portion 32. The middle portion 32 is an elongated body, and extends between the fluid inlet 28 and the second set of inlets 21B of the central cooling channels 20B. In FIG. 2B, the middle portion 32 begins at a first end 32A at an edge of the opening in the body 12 defining the fluid inlet 28, and ends at a second end 32B just before inlet 21B of the the middle cooling channel 20B'. The orientation of the middle portion 32 is parallel to that of the lateral side walls 12B of the body 12. The orientation of the middle portion 32 is parallel to that of the line between the center 28A of the fluid inlet 28 and the middle cooling channel 20B'. The middle portion 32 obstructs the inlet 21B of the middle cooling channel 20B'. Some of the walls 31A of the middle portion 32 are parallel to the lateral inner walls 27A which define the recessed protrusion area 26A. The second end 32B of the middle portion 32 has a width $W_{SE}$ that is greater than a width $W_{FE}$ of the first end 32A. The second end 32B has a rounded shape. The second end 32B has a bulbous shape. The second end 32B obstructs the inlet 21B of the middle cooling channel 20B'. The width $W_{SE}$ of the second end 32B is greater in FIG. 2B than a width $W_{MC}$ of the inlet 21B of the middle cooling channel 20B'.

Still referring to FIG. 2B, the flow divider 30 includes two or more lateral portions 34. The lateral portions 34 are protruding bodies extending from the floor 18A of the recessed area 18 and have walls 31A that are transverse to the floor 18A so as to obstruct the flow of coolant through the area of the floor 18A occupied by the lateral portions 34. The lateral portions 34 are elongated bodies, and extend between the fluid inlet 28 and the central cooling channels 20B. In FIG. 2B, the lateral portions 34 begin at a first end 34A spaced from the edge of the opening in the body 12 defining the fluid inlet 28, and end at a second end 34B before the inlets 21B of the central cooling channels 20B adjacent to the middle cooling channel 20B'. The lateral portions 34 are spaced apart from the middle portion 32 on either side of the middle portion 32 to define flow paths FP. In FIG. 2B, inner flow paths FP1 are defined between the walls 31A of the lateral portions 34 and of the middle portion 32. Coolant from the fluid inlet 28 is directed along the inner flow paths FP1 toward the inlets 21B of the central cooling channels 20B, and may be deviated away from the middle cooling channel 20B' by the wide second end 32B of the middle portion 32. Outer flow paths FP2 are defined between the walls 31A of the lateral portions 34 and the lateral inner walls 27A which define the recessed protrusion area 26A. Coolant from the fluid inlet 28 is directed along the outer flow paths FP2 toward the first set of inlets 21A of the peripheral cooling channels 20A. Some or all of the lateral portions 34 is positioned in the recessed protrusion area 26A of the protrusion 26.

Some of the walls 31A of the lateral portions 34 are parallel to parts of the lateral inner walls 27A which define the recessed protrusion area 26A. In FIG. 2B, the lateral portions 34 include an upstream segment 34C parallel to the length of the cooling channels 20. The upstream segment 34C is parallel to the lateral side walls 12B of the body 12. The upstream segment 34C is parallel to the line between the center 28A of the fluid inlet 28 and the middle cooling channel 20B'. The lateral portions 34 also include a downstream segment 34D, interconnected to or integral with the upstream segment 34C, that extends from the upstream segment 34C to direct the coolant toward the first set of inlets 21A of the peripheral cooling channels 20A. Some or all of the downstream segment 34D is transverse to the cooling channels 20.

FIG. 5 shows another configuration of the flow divider 130. The description above of the flow divider 30, its position within the body 12, and its features applies mutatis mutandis to the flow divider 130, and is not repeated now for the sake of brevity. The lateral portions 134 of the flow divider 130 have downstream segments 134D that are longer than the downstream segments 34D of the flow divider 30. The downstream segments 134D include a first section 134D' that extends from the upstream segment 134C. The first section 134D' is transverse to the line between the center 28A of the fluid inlet 28 and the middle cooling channel 20B'. The first section 134D' forms an angle of about 45° with the line between the center 28A of the fluid inlet 28 and the middle cooling channel 20B'. A second section 134D" of the downstream segments 134D extends from the first section 134D'. The second section 134D" has an orientation normal to the line between the center 28A of the fluid inlet 28 and the middle cooling channel 20B'. Coolant from the fluid inlet 28 is directed along the outer flow paths FP2 toward the first set of inlets 21A of the peripheral cooling channels 20A.

Figure 6:
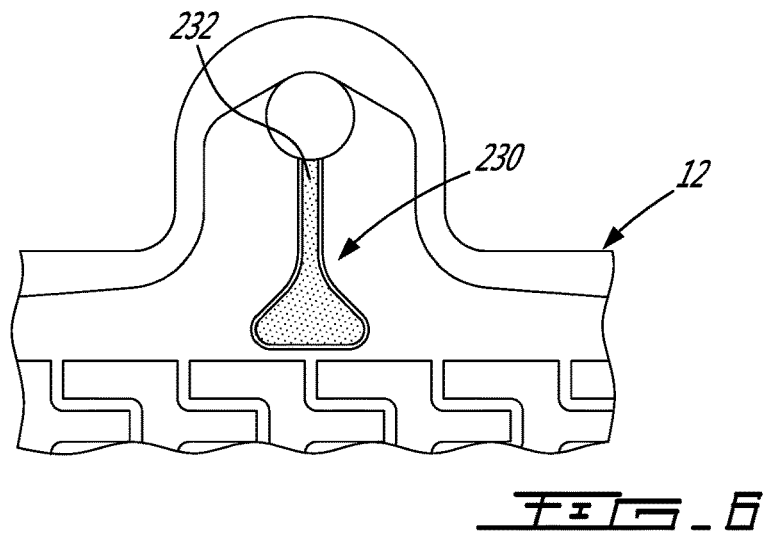
FIG. 6 is an enlarged view of another configuration of the flow divider of the first plate shown in FIG. 2A.

FIG. 6 shows another configuration of the flow divider 230. The description above of the flow divider 30, its position within the body 12, and its features applies mutatis mutandis to the flow divider 230, and is not repeated now for the sake of brevity. The flow divider 230 includes only a middle portion 232. The middle portion 232 is similar to the middle portion 32 of the flow divider 30, and thus the description above of the middle portion 32, its position within the body 12, and its features applies mutatis mutandis to the middle portion 232, and is not repeated now.

Figure 7:
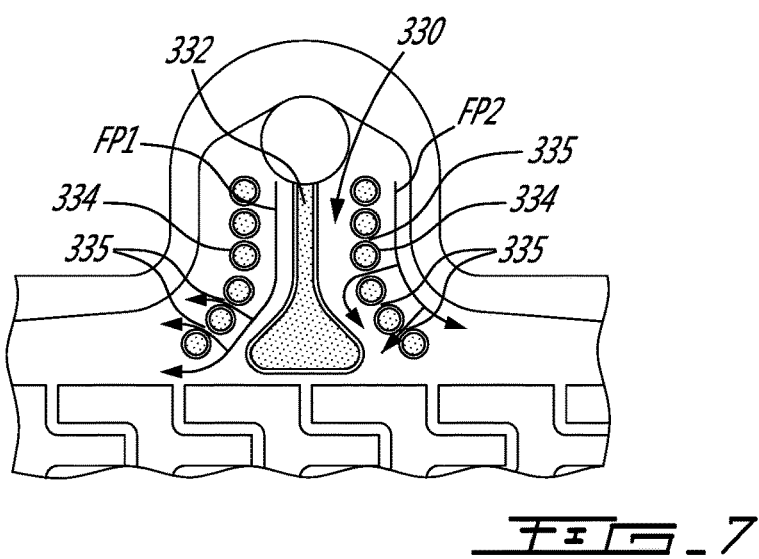
FIG. 7 is an enlarged view of another configuration of the flow divider of the first plate shown in FIG. 2A.

FIG. 7 shows another configuration of the flow divider 330. The description above of the flow divider 30, its position within the body 12, and its features applies mutatis mutandis to the flow divider 330, and is not repeated now for the sake of brevity. The flow divider 330 includes a middle portion 332 and lateral portions 334. The middle and lateral portions 332,334 are similar to the middle and lateral portions 32,34 of the flow divider 30, and thus the description above of the middle and lateral portions 32,34, their position within the body 12, and their features applies mutatis mutandis to the middle and lateral portions 332,334, and is not repeated now. In FIG. 7, the lateral portions 334 has one or more fluid openings 335 therethrough. In FIG. 7, the inner flow paths FP1 defined between the lateral portions 334 and the middle portion 332, and the outer flow paths FP2 defined between the lateral portions 334 and the lateral inner walls 27A, are "apertured". The walls 31A of the lateral portions 334 are apertured. Therefore, coolant from the fluid inlet 28 is directed along the inner and outer flow paths FP1,FP2 toward the cooling channels 20 and is able to flow through the lateral portions 334 of the flow divider 330. In an embodiment, only one of the lateral portions 334 has the fluid openings 335.

Figure 8:
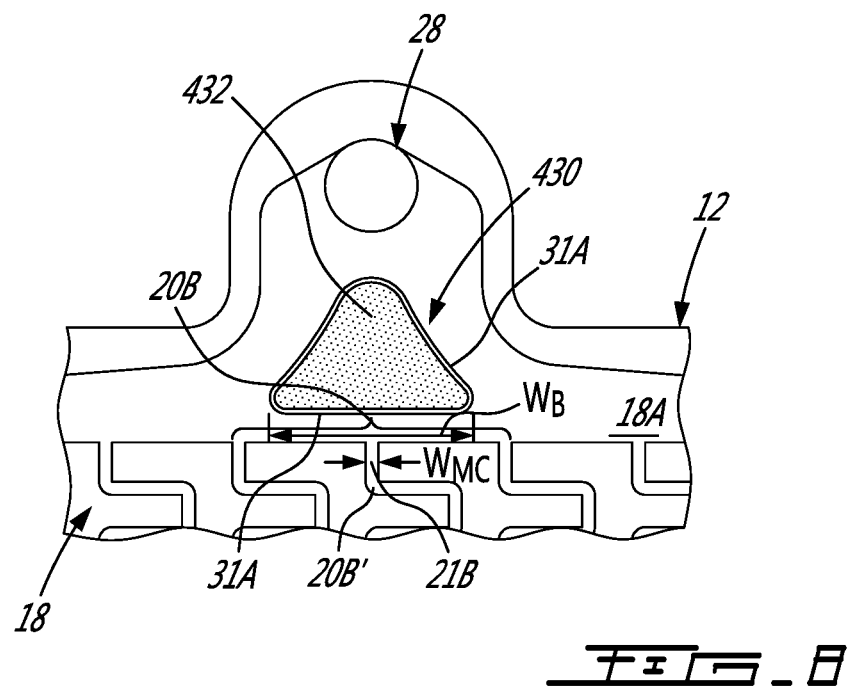
FIG. 8 is an enlarged view of another configuration of the flow divider of the first plate shown in FIG. 2A.

FIG. 8 shows another configuration of the flow divider 430. The description above of the flow divider 30, its position within the body 12, and its features applies mutatis mutandis to the flow divider 430, and is not repeated now for the sake of brevity. The flow divider 430 includes only a middle portion 432. The middle portion 432 is a protruding body extending from the floor 18A of the recessed area 18 and has walls 31A that are transverse to the floor 18A so as to obstruct the flow of coolant through the area of the floor 18A occupied by the middle portion 432. The middle portion 432 extends between the fluid inlet 28 and the central cooling channels 20B. In FIG. 8, the middle portion 432 has a substantially triangular shape, and is spaced apart from both the fluid inlet 28 and the central cooling channels 20B. The base of the middle portion 432 has a width $W_B$ that is greater than the width $W_{MC}$ of the inlet 21B of the middle cooling channel 20B'. The middle portion 432 obstructs the inlet 21B of the middle cooling channel 20B'.

Figure 9:
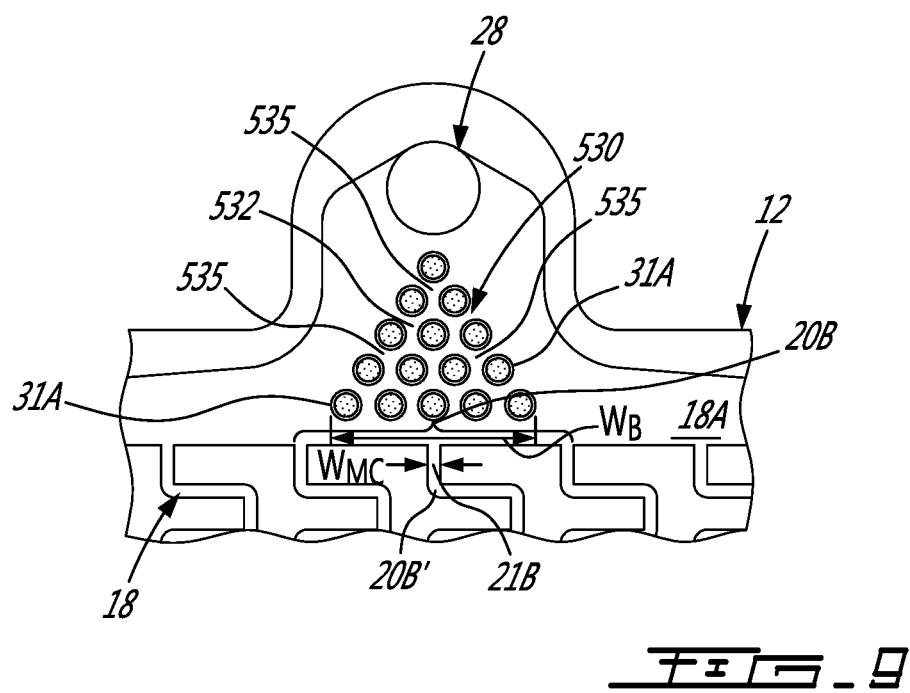
FIG. 9 is an enlarged view of another configuration of the flow divider of the first plate shown in FIG. 2A.

FIG. 9 shows another configuration of the flow divider 530. The description above of the flow divider 30, its position within the body 12, and its features applies mutatis mutandis to the flow divider 530, and is not repeated now for the sake of brevity. The flow divider 530 includes only a middle portion 532. The middle portion 532 is a protruding body extending from the floor 18A of the recessed area 18 and has walls 31A that are transverse to the floor 18A so as to partially obstruct the flow of coolant through the area of the floor 18A occupied by the middle portion 532. The middle portion 532 extends between the fluid inlet 28 and the central cooling channels 20B. In FIG. 9, the middle portion 532 has a substantially triangular shape, and is spaced apart from both the fluid inlet 28 and the central cooling channels 20B. The base of the middle portion 532 has a width $W_B$ that is greater than the width $W_{MC}$ of the inlet 21B of the middle cooling channel 20B'. The middle portion 532 has one or more fluid passages 535 extending therethrough. The walls 31A of the middle portion 532 are thus "apertured". Therefore, coolant from the fluid inlet 28 is able to flow along the fluid passages 535 and through the middle portion 532 of the flow divider 530. The shape and extend of the fluid passages 535 may be different, and may have different cross-sectional shapes.

Referring to FIGS. 2A and 2B, there is disclosed a method of distributing the coolant through the plate cooler 10. The method includes directing the coolant toward the cooling channels 20, and dividing the coolant, upstream of the cooling channels 20, to direct the coolant toward the peripheral cooling channels 20A. In an embodiment, dividing the coolant includes obstructing one of the cooling channels 20 to reduce or prevent the coolant directed thereto.

Referring to FIGS. 2A and 2B, there is also disclosed method of manufacturing the plate cooler 10. The method may include diffusion bonding the body 12 and second plate 14 together. The outer surface 16 of the body 12 and the protrusions 26 may provide structural support for the diffusion bonding process. The assembled plate cooler 10 may be permanently mounted to the PCU 11 housing via diffusion bonding. The cooling channels 20 of the body 12 may be manufactured via additive manufacturing methods including, but not limited, to direct metal laser sintering (DMLS) and electron beam melting (EBM). The cooling channels may be machined. Other manufacturing techniques, such as those described in U.S. Pat. No. 9,596,785 B2 incorporated by reference herein, may also apply.

The above description is meant to be exemplary only, and one skilled in the art will recognize that changes may be made to the embodiments described without departing from the scope of the invention disclosed. For example, although the recessed area 18 and its features (e.g. the cooling channels 20, the fluid supply and exit manifolds 22,24, and the recessed protrusion area 26A) are described above as being defined in the body 12 or first plate, it will be appreciated that the recessed area 18 and its features may be defined in the second plate 14, or in both the body 12 and the second plate 14. Still other modifications which fall within the scope of the present invention will be apparent to those skilled in the art, in light of a review of this disclosure, and such modifications are intended to fall within the appended claims.

The invention claimed is:

1. A plate cooler for aircraft electronic components, the plate cooler comprising:
cooling channels each defining a tortuous flow path, the cooling channels arranged with side-by-side cooling channel inlets fed from a common fluid supply manifold extending to the cooling channel inlets from a manifold inlet, the cooling channel inlets including a first set of inlets spaced further away from the manifold inlet than a second set of inlets, the fluid supply manifold having a flow divider positioned fluidly between the manifold inlet and the cooling channels inlets, the flow divider having a first portion and a second portion extending transverse to the first portion, the second portion extending across one or more inlets of the second set of inlets and obstructing the one or more inlets of the second set of inlets, the second portion configured in use to direct coolant entering the manifold from the manifold inlet toward the first set of inlets, wherein the first portion of the flow divider is a middle portion extending from the manifold inlet in a direction parallel to a length of the cooling channels and the second portion of the flow divider includes lateral portions extending between the manifold inlet and the second set of inlets, the lateral portions spaced apart from the middle portion on either side thereof and defining flow paths between the lateral portions and the middle portion.

2. The plate cooler of claim 1, wherein the first portion of the flow divider extends in a direction parallel to a line between a center of the manifold inlet and one of the second set of inlets.

3. The plate cooler of claim 1, comprising a protrusion extending outwardly from a side wall of the plate cooler and being coplanar therewith, the manifold inlet and at least part of the flow divider positioned in the protrusion.

4. The plate cooler of claim 1, wherein the flow divider includes surfaces configured in use to direct coolant from the manifold inlet to the first set of inlets located at lateral peripheries of the plate cooler.

5. The plate cooler of claim 1, wherein the first portion of the flow divider is a middle portion extending from the manifold inlet in a direction parallel to a length of the cooling channels, and the second portion of the flow divider is at a second end of the middle portion and extends perpendicularly to the middle portion, the second portion being bulbous.

6. The plate cooler of claim 5, wherein the middle portion extends between a first end at the manifold inlet and the second end, the second end of the middle portion disposed adjacent to the second set of inlets, the second end having a width greater than a width of the first end.

7. The plate cooler of claim 1, wherein the lateral portions include an upstream segment parallel to the length of the cooling channels, and a downstream segment extending from the upstream segment to direct the coolant toward the first set of inlets located at lateral peripheries of the plate cooler.

8. The plate cooler of claim 7, wherein at least part of the downstream segment is transverse to the cooling channels.

9. The plate cooler of 1, wherein the walls of one or both of the lateral portions has fluid openings therethrough.

10. The plate cooler of claim 1, wherein the flow divider is spaced apart from the manifold inlet, and spaced apart from the second set of inlets.

11. The plate cooler of claim 1, wherein walls of the flow divider define at least one fluid passage on one of the walls.

12. The plate cooler of claim 1, further comprising a second flow divider positioned in a fluid exit manifold between a manifold outlet and cooling channel outlets of the cooling channels.

13. The plate cooler of claim 1, wherein the flow divider has walls protruding from a floor of the fluid supply manifold and obstructing at least partially the one or more inlets of the second set of inlets of the cooling channel inlets, the flow divider configured in use to direct the coolant entering the manifold from the manifold inlet along the walls and the floor toward the first set of cooling channel inlets.

14. The plate cooler of claim 1, wherein the first portion of the flow divider is a middle portion extending from a first end adjacent the manifold inlet in a direction parallel to a length of the cooling channels to a second end, and the second portion of the flow divider is bulbous and at the second end, the second portion spaced from a middlemost inlet of the second set of inlets, the second portion obstructing the middlemost inlet.

15. The plate cooler of claim 1, comprising lateral side walls and longitudinal side walls, and a protrusion extending outwardly from a straight line defined by one of the longitudinal side walls of the plate cooler and being coplanar therewith, the protrusion positioned closer to one of the lateral side walls than to the other lateral side wall, the manifold inlet and at least part of the flow divider positioned in the protrusion.

16. A method of distributing coolant through a plate cooler for aircraft electronic components, the method comprising:
directing the coolant toward cooling channels each defining a tortuous flow path in the plate cooler arranged with side-by-side cooling channel inlets; and
dividing the coolant, upstream of the cooling channels, by obstructing one or more of the cooling channels inlets to direct the coolant toward the cooling channels inlets along a periphery of the plate cooler, wherein the coolant is divided by a flow divider having a first portion and a second portion extending transverse to the first portion, the second portion extending across the one or more of the cooling channel inlets, wherein the first portion of the flow divider is a middle portion extending from a manifold inlet in a direction parallel to a length of the cooling channels, and the second portion of the flow divider includes lateral portions extending between the manifold inlet and the one or more of the cooling channel inlets, the lateral portions spaced apart from the middle portion on either side thereof and defining flow paths between the lateral portions and the middle portion.

17. The method of claim 16, wherein dividing the coolant includes obstructing the one or more of the cooling channel inlets to reduce the coolant directed thereto.

18. The method of claim 16, wherein dividing the coolant includes directing the coolant along a flow path along a floor of the plate cooler, the flow path being transverse to a length of the cooling channels.

19. A heat exchanger for aircraft electronic components, comprising:
- a first plate having lateral side walls and longitudinal side walls, channels between the lateral side walls and the longitudinal side walls, each of the channels defining a tortuous flow path, the channels arranged with side-by-side channel inlets fed from a common fluid supply manifold extending to the channel inlets from a manifold inlet, the channel inlets including a first set of inlets spaced further away from the manifold inlet than a second set of inlets, the fluid supply manifold having a flow divider positioned fluidly between the manifold inlet and the channel inlets, the flow divider having a first portion and a second portion extending transverse to the first portion, the second portion extending across one or more inlets of the second set of inlets and obstructing the one or more inlets of the second set of inlets, the second portion configured in use to direct heat exchange fluid entering the manifold from the manifold inlet toward the first set of inlets, wherein a protrusion extends outwardly from a straight line defined by one of the longitudinal side was and being coplanar therewith the protrusion positioned closer to one of the lateral side wails than to the other lateral side wail, the manifold inlet and at least cart of the flow divider positioned in the protrusion; and
- a second plate coupled with the first plate to seal the channels and the fluid supply manifold.

* * * * *